(12) United States Patent
Sugiyama (10) Patent No.: US 9,233,390 B2
(45) Date of Patent: Jan. 12, 2016

(54) PROCESSING CUP AND SUBSTRATE PROCESSING APPARATUS

(71) Applicant: Minoru Sugiyama, Kyoto (JP)

(72) Inventor: Minoru Sugiyama, Kyoto (JP)

(73) Assignee: SCREEN Semiconductor Solutions Co., Ltd. (JP)

( * ) Notice: Subject to any disclaimer, the term of this patent is extended or adjusted under 35 U.S.C. 154(b) by 112 days.

(21) Appl. No.: 13/920,261

(22) Filed: Jun. 18, 2013

(65) Prior Publication Data

US 2014/0060424 A1 Mar. 6, 2014

(30) Foreign Application Priority Data

Sep. 3, 2012 (JP) .................................. 2012-193167

(51) Int. Cl.
*B05C 11/10* (2006.01)
*B05C 5/00* (2006.01)
*H01L 21/67* (2006.01)
(Continued)

(52) U.S. Cl.
CPC ............... *B05C 11/1039* (2013.01); *B05C 5/00* (2013.01); *H01L 21/6715* (2013.01); *B05C 11/08* (2013.01); *G03F 7/162* (2013.01); *G03F 7/3021* (2013.01); *H01L 21/67126* (2013.01); *H01L 21/67178* (2013.01); *Y10T 137/5762* (2015.04)

(58) Field of Classification Search
CPC ...... B05C 5/00; B05C 11/1039; B05C 11/08; B08B 3/04; G03F 7/162; G03F 7/3021; H01L 21/67178; H01L 21/67126; H01L 21/6715
USPC .............. 118/52, 56, 319, 320, 500; 427/240; 134/902
See application file for complete search history.

(56) References Cited

U.S. PATENT DOCUMENTS 5,762,709 A 6/1998 Sugimoto et al. ................ 118/52
5,861,061 A 1/1999 Hayes et al. ..................... 118/52
(Continued)

FOREIGN PATENT DOCUMENTS

JP 2002-361155 12/2002
JP 2007-287998 11/2007
(Continued)

OTHER PUBLICATIONS

Office Action dated Mar. 18, 2015 in corresponding Taiwanese Patent Application No. 102131120.

*Primary Examiner* — Laura Edwards
(74) *Attorney, Agent, or Firm* — Ostrolenk Faber LLP (57) ABSTRACT

A substrate is surrounded by an inner cup and an outer cup. A distance between an upper surface of an inner cup lower portion and a lower surface of an inner cup upper portion of the inner cup is gradually reduced outward from an outer periphery of the substrate. A clearance is formed between the upper surface of the inner cup lower portion and the lower surface of the inner cup upper portion at outer peripheries of the inner cup lower portion and the inner cup upper portion. A collection space is formed between the upper surface of the inner cup lower portion and the lower surface of the inner cup upper portion. A scatter capturing space that allows a processing liquid that has passed through the clearance to scatter and captures the scattering processing liquid is formed by an outer cup. An upper portion and an outer periphery of the scatter capturing space are covered by a lower surface and an inner side surface of the outer cup, respectively. The processing liquid that has passed through the clearance is led to the inner side surface by the lower surface of the outer cup.

17 Claims, 8 Drawing Sheets (51) Int. Cl.
  *G03F 7/16* (2006.01)
  *G03F 7/30* (2006.01)
  *B05C 11/08* (2006.01)

(56) References Cited

U.S. PATENT DOCUMENTS

| | | | |
|---|---|---|---|
| 6,168,660 B1 | 1/2001 | Hayes et al. | 118/52 |
| 7,793,610 B2 | 9/2010 | Akimoto et al. | 118/52 |
| 8,042,560 B2 | 10/2011 | Ito | 134/137 |
| 2003/0101928 A1 | 6/2003 | Chuang et al. | 118/52 |
| 2004/0226655 A1* | 11/2004 | Kajino et al. | 156/345.11 |

FOREIGN PATENT DOCUMENTS

| | | |
|---|---|---|
| JP | 2007-311775 | 11/2007 |
| JP | 2009-038083 | 2/2009 |
| JP | 2012-019025 | 1/2012 |

* cited by examiner

PROCESSING CUP AND SUBSTRATE
PROCESSING APPARATUS

BACKGROUND OF THE INVENTION (1) Field of the Invention

The present invention relates to a processing cup and a substrate processing apparatus including the processing cup.

(2) Description of Related Art

Rotary substrate processing apparatuses have been used to subject semiconductor wafers and substrates such as glass substrates for liquid crystal display devices, glass substrates for photomasks, and glass substrates for optical disks to processing using processing liquids such as development liquids, cleaning liquids, rinse liquids, or photoresist liquids.

In the rotary substrate processing apparatuses, spin holders horizontally support the substrates. The spin holders rotate the substrates while the processing liquids are dropped on the centers of upper surfaces of the substrates. Thus, the substrates are processed using the processing liquids. In such a substrate processing apparatus, a processing cup surrounds a spin holder to prevent part of a processing liquid from splashing to the vicinity of the substrate by a centrifugal force developed when the substrate is rotated (e.g., JP 2002-361155 A, JP 2007-287998 A, JP 2007-311775 A, JP 2009-38083 A and JP 2012-19025 A).

BRIEF SUMMARY OF THE INVENTION

In each substrate processing apparatus described in JP 2002-361155 A, JP 2007-287998 A, JP 2007-311775 A, JP 2009-38083 A and JP 2012-19025 A, the processing liquid that has splashed to the vicinity of the substrate may adhere to the substrate again by catching a returning air flow. For example, in a liquid processing apparatus described in JP 2007-287998 A, a gas collector is provided in the vicinity of the substrate such that such a returning air flow is trapped. It is described that this causes a re-adherence of the processing liquid that has splashed to the vicinity of the substrate to the substrate to be suppressed. However, the processing liquid that has splashed to the vicinity of the substrate cannot be reliably prevented from adhering to the substrate again.

An object of the present invention is to provide a processing cup and a substrate processing apparatus that can reliably prevent a processing liquid that has splashed outward from a substrate from adhering to the substrate again.

(1) According to an aspect of the present invention, a processing cup provided to surround a substrate when processing using a processing liquid is performed on the substrate held in a substantially horizontal attitude includes a first cup arranged to surround the substrate, and a second cup arranged to surround the first cup, wherein the first cup includes a first member having a first upper surface arranged to surround the substrate and a second member having a first lower surface arranged above the first upper surface of the first member to surround the substrate, the first and second members are configured such that a distance between the first upper surface and the first lower surface is gradually reduced outward from an outer periphery of the substrate and a clearance is formed between the first upper surface and the first lower surface at outer peripheries of the first and second members, a first collection space that collects a processing liquid is formed between the first upper surface and the first lower surface, and the second cup is configured to form a scatter capturing space that allows the scattering of the processing liquid that has passed through the clearance and captures the scattering processing liquid, and has a second lower surface covering an upper portion of the scatter capturing space and an inner side surface covering an outer periphery of the scatter capturing space, the second lower surface being formed to lead the processing liquid that has passed through the clearance to the inner side surface.

In this processing cup, the first and second members are arranged to surround the substrate. The distance between the first upper surface of the first member and the first lower surface of the second member is gradually reduced outward from the outer periphery of the substrate. The clearance is formed between the first upper surface and the first lower surface at the outer peripheries of the first and second members.

In this case, the distance between the first upper surface and the first lower surface is the largest at a position that is the closest to the substrate. Therefore, the processing liquid that has splashed outward from the substrate is collected in the first collection space formed between the first upper surface and the first lower surface. The collected processing liquid is led outward along the first upper surface and the first lower surface, thereby being gathered in the clearance at the outer peripheries and passing through the clearance.

The second cup is arranged to surround the first and the second members. The scatter capturing space is formed by the second cup. The upper portion and the outer periphery of the scatter capturing space are covered by the second lower surface and the inner side surface of the second cup, respectively. The processing liquid that has passed through the clearance of the first cup is captured at the inner side surface of the second cup after scattering in the scatter capturing space in the second cup. Further, part of the processing liquid that has passed through the clearance is led to the inner side surface of the second cup by the second lower surface.

This configuration causes the processing liquid that has once passed outward through the clearance of the first cup to be sufficiently captured in the scatter capturing space in the second cup, thereby not passing through the clearance again to return to the first collection space. As a result, the processing liquid that has splashed outward from the substrate can be reliably prevented from adhering to the substrate again.

(2) A second collection space that collects the processing liquid may be formed below the first member.

The processing liquid that splashes from the substrate may splash to below the first member. Even in this case, the processing liquid that has splashed to below the first member is collected in the second collection space. Thus, the processing liquid that has splashed outward from the substrate can be reliably prevented from adhering to the substrate again.

(3) The second cup may be configured to further form an acquisition space that acquires the processing liquid on a peripheral edge of the scatter capturing space.

Even if the processing liquid that has collided with the inner side surface of the second cup spreads upward or floats up, the processing liquid is acquired in the acquisition space. Thus, a sufficient amount of the processing liquid can be captured or acquired in the scatter capturing space and the acquisition space in the second cup.

(4) The first upper surface of the first member, the first lower surface of the second member and the clearance may be shaped to be rotationally-symmetric about a common axis.

In this case, the processing cup can be provided at the rotary substrate processing apparatus. When the processing using the processing liquid is performed on the substrate while the substrate is rotated, the processing liquid that has splashed in an every direction from the substrate can be reliably collected in the first collection space. Further, the processing liquid that has been collected in the first collection space and has passed through the clearance can be reliably captured in the scatter capturing space.

(5) The scatter capturing space may be shaped to be non-circular about the common axis. In this case, the scatter capturing space can be made larger than the circular scatter capturing space without increasing a size of the processing cup as a whole. Thus, even if processing using a large amount of the processing liquid is performed in the processing cup, the processing liquid that has splashed outward from the substrate can be reliably prevented from adhering to the substrate again.

(6) The scatter capturing space may be shaped to be rectangular in a cross section vertical to the common axis.

In this case, a capacity at four corners of the scatter capturing space increases. Thus, the scatter capturing space can be reliably made larger than the circular scatter capturing space without increasing the size of the processing cup as a whole. Therefore, even if the processing using a large amount of the processing liquid is performed in the processing cup, the processing liquid that has splashed outward from the substrate can be reliably prevented from adhering to the substrate again.

(7) The first upper surface of the first member may be formed to be inclined outward upward at a first angle with respect to an upper surface of the substrate. In this case, the processing liquid that has splashed outward from the substrate can be easily collected in the first collection space.

(8) The first angle may be not less than 5 degrees and not more than 20 degrees. In this case, the processing liquid that has splashed outward from the substrate can reliably pass through the clearance between the first upper surface of the first member and the first lower surface of the second member, and the processing liquid that has hit the first upper surface of the first member can be reliably prevented from rebounding on the substrate.

(9) The first lower surface of the second member may be formed to extend outward in parallel with an upper surface of the substrate or to be inclined downward at a second angle with respect to the upper surface of the substrate.

In this case, the processing liquid adhering to the first lower surface of the second member is led to the first collection space via the first lower surface by outward splashing force or gravity. Thus, the processing liquid that has splashed outward from the substrate can be easily collected in the first collection space.

(10) The second angle may be more than 0 degree and not more than 20 degrees. In this case, the processing liquid that has splashed outward from the substrate can reliably pass through the clearance between the first upper surface of the first member and the first lower surface of the second member, and the processing liquid that has hit the first lower surface of the second member can be reliably prevented from rebounding on the substrate.

(11) The second lower surface may be formed to extend outward in parallel with an upper surface of the substrate or to be inclined downward at a third angle with respect to the upper surface of the substrate.

In this case, the processing liquid that has passed through the clearance and has adhered to the second lower surface is led to the inner side surface via the second lower surface by the outward splashing force or gravity. Thus, the processing liquid that has passed through the clearance can be reliably captured in the scatter capturing space.

(12) The third angle may be more than 0 degree and not more than 20 degrees. In this case, the processing liquid that has passed through the clearance and has hit the second lower surface can be reliably prevented from rebounding to the first collection space.

(13) A maximal length of the scatter capturing space may be larger than a maximal length of the first collection space in a radial direction of the substrate.

In this case, a large amount of the processing liquid can be captured in the scatter capturing space. Therefore, even if a large amount of the processing liquid has passed through the clearance of the first cup, the processing liquid that has rebounded on the inner side surface of the second cup in a direction toward the first collection space can be reliably prevented from passing through the clearance again to return to the first collection space.

(14) The second cup may further have a second upper surface covering a lower portion of the scatter capturing space, a distance between the second lower surface and the second upper surface being gradually reduced outward from outer peripheries of the first lower surface and the first upper surface.

In this case, the processing liquid that has passed through the clearance of the first cup is reliably led to the inner side surface of the second cup by the second upper surface and the second lower surface. Thus, the processing liquid that has splashed outward from the substrate can be reliably prevented from adhering to the substrate again.

(15) The processing cup may further include a drain port that leads the processing liquid in the scatter capturing space to a drain system. In this case, the processing liquid that has been captured in the scatter capturing space can be reliably drained.

(16) According to another aspect of the present invention, a substrate processing apparatus that performs processing on a substrate includes a spin holder that rotates the substrate while holding the same in a substantially horizontal attitude, a first processing liquid supply system that supplies a processing liquid to a first surface of the substrate held by the spin holder, and the processing cup described above provided to surround the substrate held by the spin holder.

In this substrate processing apparatus, the substrate is held in a horizontal attitude and rotated by the spin holder. Further, the processing liquid is supplied to the first surface of the substrate by the first processing liquid supply system. The processing liquid that has splashed outward from the first surface of the substrate by the centrifugal force developed by the rotation of the substrate is collected in the first collection space formed between the first upper surface and the first lower surface. The collected processing liquid is led outward along the first upper surface and the first lower surface, thereby being gathered in the clearance at the outer peripheries and passing through the clearance.

The processing liquid that has passed through the clearance of the first cup is captured at the inner side surface of the second cup after scattering in the scatter capturing space in the second cup. Further, part of the processing liquid that has passed through the clearance is led to the inner side surface of the second cup by the second lower surface.

This configuration causes the processing liquid that has once passed outward through the clearance of the first cup to be sufficiently captured in the scatter capturing space in the second cup, thereby not passing through the clearance again to return to the first collection space. As a result, the processing liquid that has splashed outward from the substrate can be reliably prevented from adhering to the substrate again.

(17) The substrate processing apparatus may further include a second processing liquid supply system that supplies a processing liquid on a second surface that is opposite to the first surface of the substrate held by the spin holder, and a processing gas supply system that supplies a processing gas to the second surface of the substrate held by the spin holder.

In this case, outward force generated by the processing gas supplied to the second surface of the substrate by the processing gas supply system is added to the processing liquid that has been supplied to the second surface of the substrate by the second processing liquid supply system. The outward force is added to the centrifugal force developed by the rotation of the substrate, so that the processing liquid that has splashed outward from the second surface of the substrate is reliably captured in the scatter capturing space in the second cup. As a result, the processing liquid that has splashed outward from the substrate can be reliably prevented from adhering to the substrate again.

Other features, elements, characteristics, and advantages of the present invention will become more apparent from the following description of preferred embodiments of the present invention with reference to the attached drawings.

DESCRIPTION OF THE PREFERRED EMBODIMENTS

Figure 1:
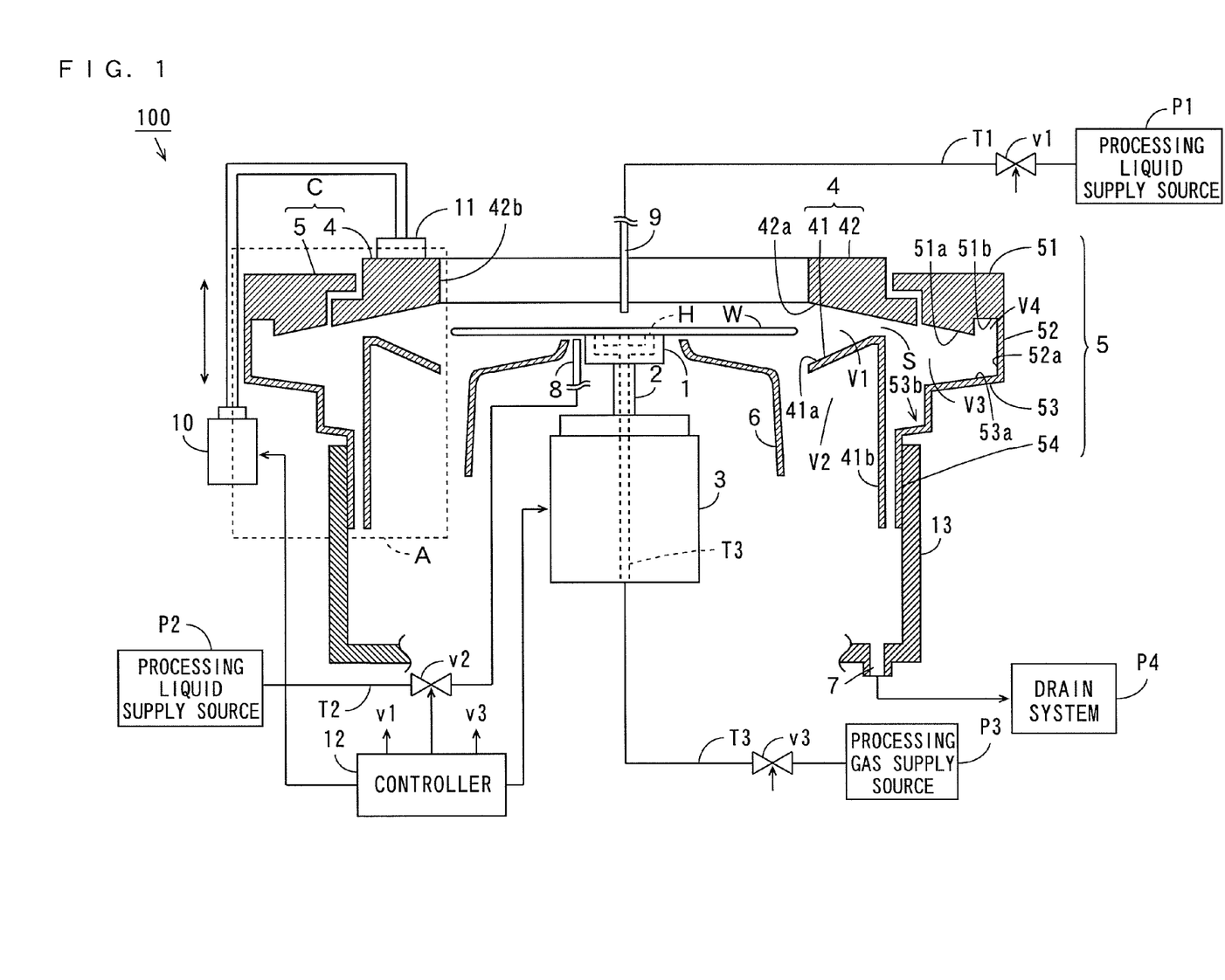
FIG. 1 is a schematic cross sectional view of a rotary substrate processing apparatus including a processing cup according to one embodiment of the present invention taken along one direction.
Figure 2:
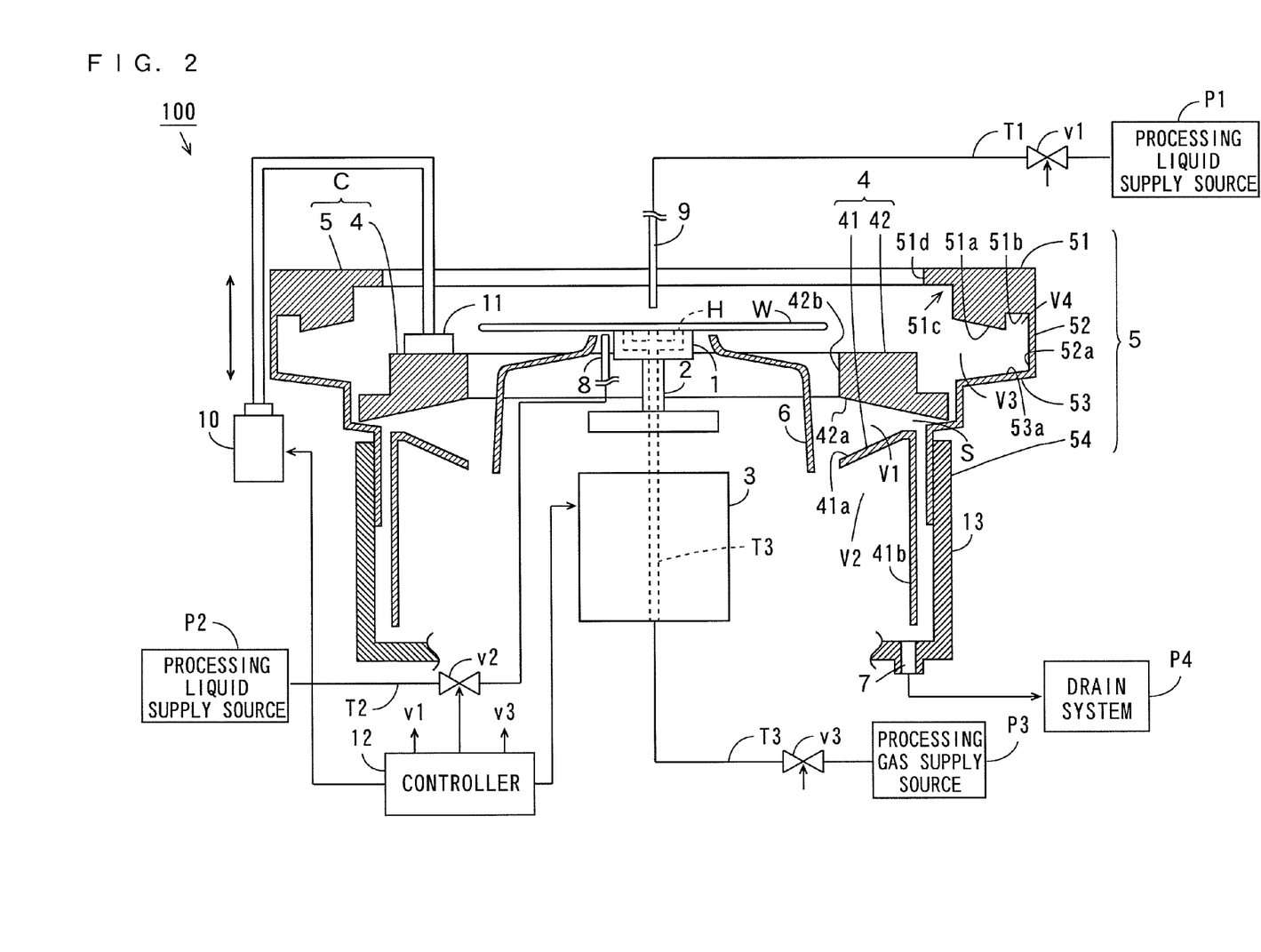
FIG. 2 is a schematic cross sectional view of the rotary substrate processing apparatus including the processing cup according to the one embodiment of the present invention taken along the one direction.
Figure 3:
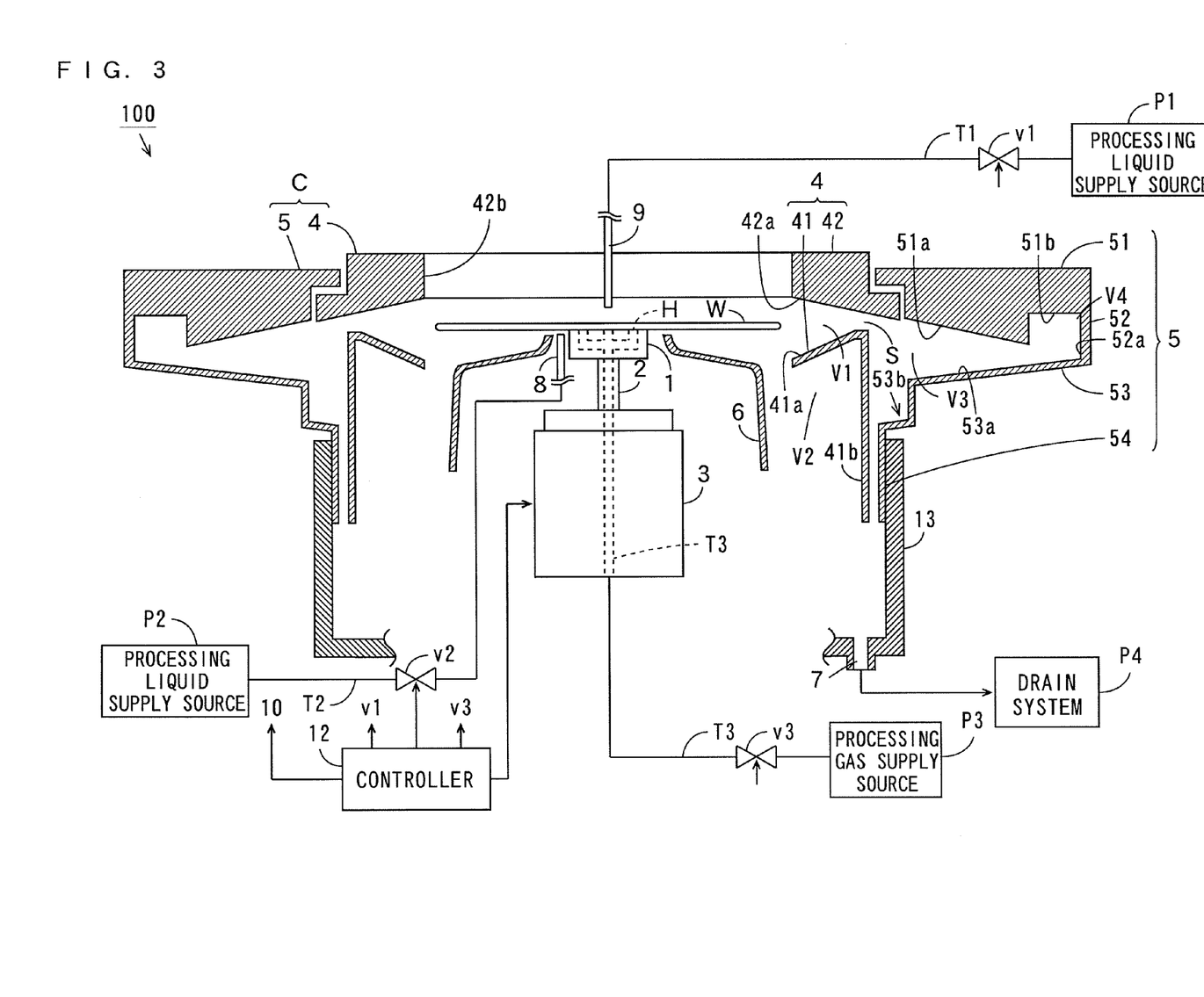
FIG. 3 is a schematic cross sectional view of the rotary substrate processing apparatus including the processing cup according to the one embodiment of the present invention taken along another direction.
Figure 4:
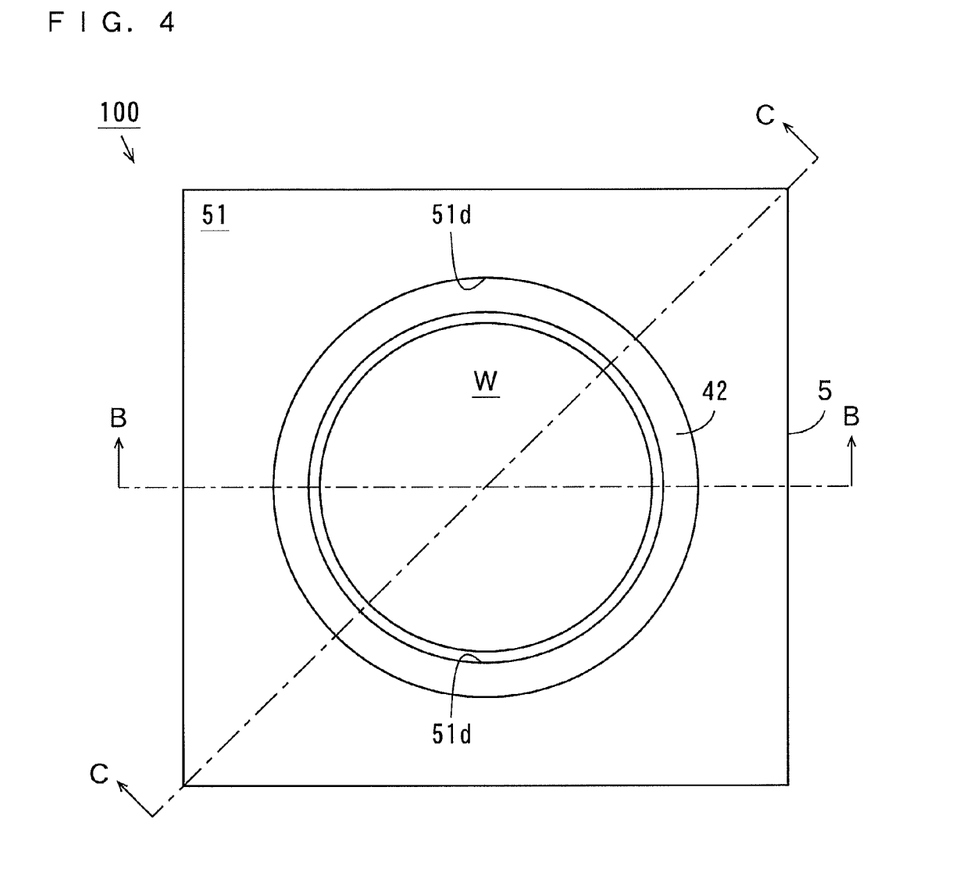
FIG. 4 is a plan view of the rotary substrate processing apparatus of FIGS. 1 to 3.
Figure 5:
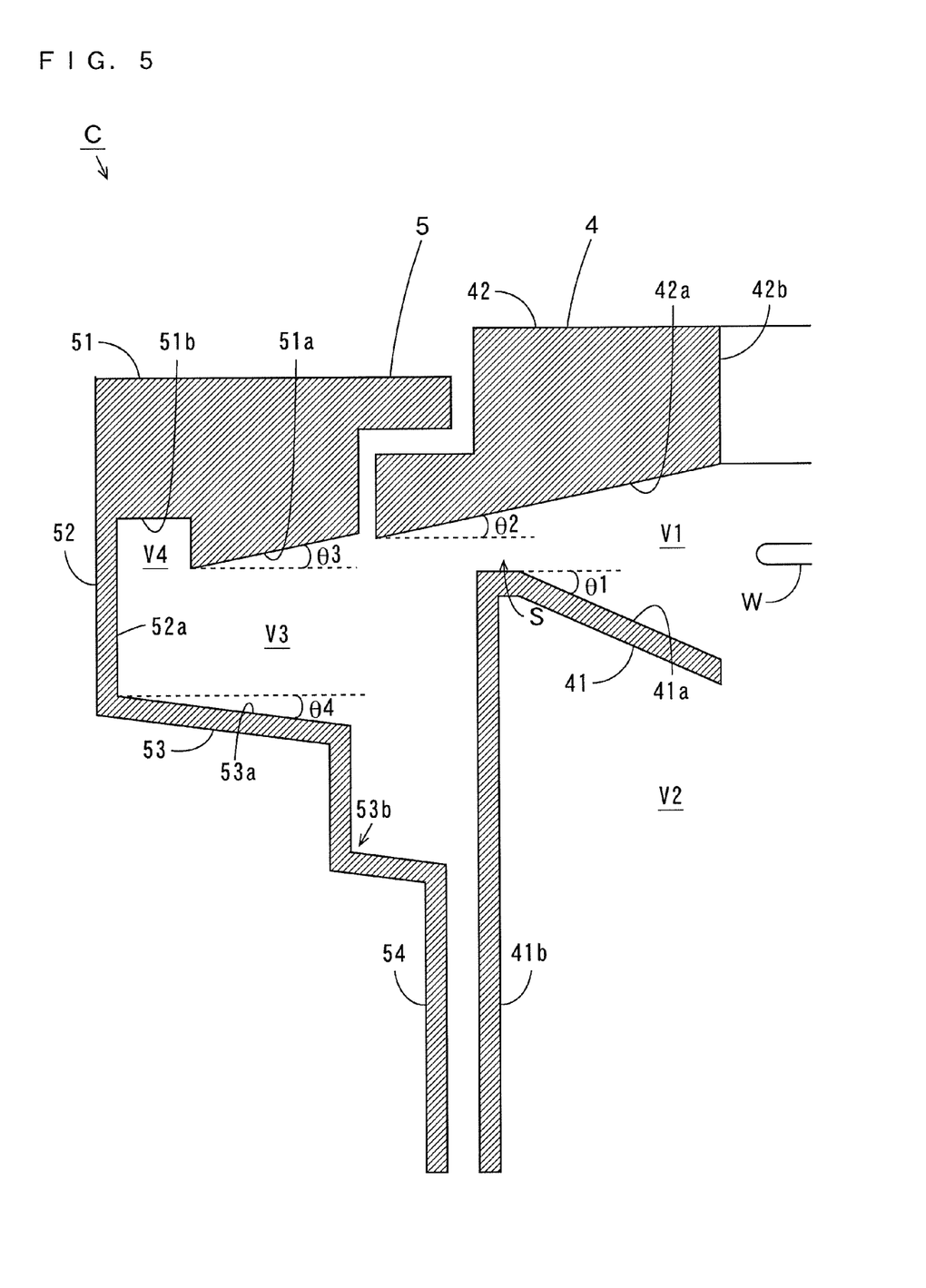
FIG. 5 is an enlarged cross sectional view of a section A of the processing cup of FIG. 1.

A rotary substrate processing apparatus including a processing cup according to an embodiment of the present invention will be described below with reference to the drawings. FIGS. 1 and 2 are schematic cross sectional views of the rotary substrate processing apparatus including the processing cup according to the one embodiment of the present invention taken along one direction. FIG. 3 is a schematic cross sectional view of the rotary substrate processing apparatus including the processing cup according to the one embodiment of the present invention taken along another direction. FIG. 4 is a plan view of the rotary substrate processing apparatus of FIGS. 1 to 3. FIG. 5 is an enlarged cross sectional view of a section A of the processing cup of FIG. 1. Note that FIGS. 1 and 2 are cross sectional views taken along the line B-B of FIG. 4, and FIG. 3 is a cross sectional view taken along the line C-C of FIG. 4.

As shown in FIGS. 1 to 3, the substrate processing apparatus 100 has a spin holder 1 that holds a substrate W in a horizontal attitude while rotating the same. The spin holder 1 is attached to a tip end of a rotation shaft 2 of a motor 3 and is driven to rotate around a vertical axis.

An inner cup 4 for splash guarding is provided to surround the substrate W held by the spin holder 1. An outer cup 5 for splash guarding and a cup support member 13 are provided to surround the inner cup 4. The inner cup 4, the outer cup 5 and the cup support member 13 are shaped to be rotationally-symmetric with respect to the rotation shaft 2. This enables the inner cup 4 and the outer cup 5 to be provided at the rotary substrate processing apparatus 100. The inner cup 4 and the outer cup 5 are provided not to be rotated around the rotation shaft 2. A processing cup C is constituted by the inner cup 4 and the outer cup 5.

The outer cup 5 is supported by the cup support member 13. A cylinder 10 is connected to the inner cup 4 with a support frame 11 sandwiched therebetween. The inner cup 4 can be moved in a vertical direction by the operation of this cylinder 10. As shown in FIG. 2, the upper end of the inner cup 4 can be moved to a position lower than the substrate W. Hereinafter, as shown in FIG. 1, a state where the inner cup 4 is moved to the highest position is referred to as a lifted state. As shown in FIG. 2, a state where the inner cup 4 is moved to the lowest position is referred to as a lowered state.

The inner cup 4 is constituted by an inner cup lower portion 41 and an inner cup upper portion 42. Outer edges of the inner cup lower portion 41 and the inner cup upper portion 42 are shaped to be substantially circular in a cross section vertical to the rotation shaft 2 (hereinafter referred to as a horizontal cross section), and inner edges of the inner cup lower portion 41 and the inner cup upper portion 42 are shaped to be substantially circular in the horizontal cross section. That is, the inner cup lower portion 41 and the inner cup upper portion 42 are shaped to be substantially annular in the horizontal cross section. A circular opening 42b is formed at the center of the inner cup upper portion 42.

The inner cup lower portion 41 is arranged to surround a space below the substrate W in the lifted state. As shown in FIG. 2, when the inner cup 4 is in the lowered state, the substrate W is positioned above the opening 42b of the inner cup upper portion 42. The inner cup lower portion 41 has an upper surface 41a and a side surface 41b. The side surface 41b is formed to extend downward from an outer edge of the upper surface 41a.

The inner cup upper portion 42 is arranged to surround a space above the substrate W and to be positioned above the inner cup lower portion 41. The inner cup upper portion 42 has a lower surface 42a.

As shown in FIG. 5, the upper surface 41a of the inner cup lower portion 41 is inclined obliquely upward toward an outer periphery. An inclination angle of the upper surface 41a of the inner cup lower portion 41 with respect to a horizontal plane is $\theta 1$. In the present embodiment, the inclination angle $\theta 1$ is not less than 5 degrees and not more than 20 degrees, for example. The lower surface 42a of the inner cup upper portion 42 is inclined obliquely downward toward an outer periphery. The inclination angle of the lower surface 42a of the inner cup upper portion 42 with respect to the horizontal plane is $\theta 2$. In the present embodiment, the inclination angle $\theta 2$ is more than 0 degree and not more than 20 degrees, for example.

A space V1 is formed between the upper surface 41a of the inner cup lower portion 41 and the lower surface 42a of the inner cup upper portion 42. Further, a space V2 is formed below the inner cup lower portion 41. Hereinafter, the spaces V1, V2 are referred to as collection spaces V1, V2.

A distance between the upper surface 41a of the inner cup lower portion 41 and the lower surface 42a of the inner cup upper portion 42 is gradually reduced outward from an outer periphery of the substrate W. A clearance S is formed between the upper surface 41a of the inner cup lower portion 41 and the lower surface 42a of the inner cup upper portion 42 at the outer peripheries of the upper surface 41a of the inner cup lower portion 41 and the lower surface 42a of the inner cup upper portion 42. The inner cup lower portion 41 and the inner cup upper portion 42 may be configured to be independently movable in the vertical direction, respectively. In this case, a length of the clearance S in the vertical direction can be adjusted. The length of the clearance S in the vertical direction is from 1 mm to 5 mm, for example, and 2 mm in the present embodiment.

As shown in FIGS. 1 to 3, the outer cup 5 is constituted by an outer cup upper portion 51, an outer cup side portion 52, an outer cup intermediate portion 53 and an outer cup lower portion 54. Outer edges of the outer cup upper portion 51, the outer cup side portion 52 and the outer cup intermediate portion 53 are shaped to be substantially rectangular in the horizontal cross section, and inner edges of the outer cup upper portion 51, the outer cup side portion 52 and the outer cup intermediate portion 53 are shaped to be substantially circular in the horizontal cross section. Outer and inner edges of the outer cup lower portion 54 are shaped to be substantially circular in the horizontal cross section. That is, the outer cup lower portion 54 is shaped to be substantially annular in the horizontal cross section. A circular opening 51d (See FIG. 2) is formed at the center of the outer cup upper portion 51. When the inner cup 4 is in the lifted state, the inner cup upper portion 42 is fitted into the opening 51d of the outer cup upper portion 51.

The outer cup upper portion 51 is arranged to surround the inner cup lower portion 41 and the inner cup upper portion 42. The outer cup upper portion 51 has a lower surface 51a. As shown in FIG. 5, the lower surface 51a of the outer cup upper portion 51 is inclined obliquely downward toward an outer periphery. The inclination angle of the lower surface 51a of the outer cup upper portion 51 with respect to the horizontal plane is θ3. In the present embodiment, the inclination angle θ3 is more than 0 degree and not more than 20 degrees, for example.

A groove 51b is formed at the outer edge of the outer cup upper portion 51 such that a space V4 is formed on a peripheral edge of a space V3 described below. Hereinafter, the space V4 is referred to as the acquisition space V4. An upper engaging portion 51c (see FIG. 2) for engaging the inner cup upper portion 42 when the inner cup 4 is in the lifted state is formed at the inner edge of the outer cup upper portion 51.

The outer cup intermediate portion 53 is arranged to surround the inner cup lower portion 41 or the inner cup upper portion 42 at a position lower than the substrate W. The outer cup intermediate portion 53 has an upper surface 53a. The upper surface 53a of the outer cup intermediate portion 53 is inclined obliquely upward toward an outer periphery. The inclination angle of the upper surface 53a of the outer cup intermediate portion 53 with respect to the horizontal plane is θ4. In the present embodiment, the inclination angle θ4 is not less than 5 degrees and not more than 20 degrees, for example. A distance between the upper surface 53a of the outer cup intermediate portion 53 and the lower surface 51a of the outer cup upper portion 51 is gradually reduced outward from the outer periphery of the substrate W. A lower engaging portion 53b for engaging the inner cup upper portion 42 when the inner cup 4 is in the lowered state is formed at the inner edge of the outer cup intermediate portion 53.

The outer cup side portion 52 connects the outer edge of the outer cup upper portion 51 and the outer edge of the outer cup intermediate portion 53, and is arranged to surround the inner cup lower portion 41 and the inner cup upper portion 42. The outer cup side portion 52 has an inner side surface 52a. The outer cup lower portion 54 extends downward from the lower engaging portion 53b at the inner edge of the outer cup intermediate portion 53 and is arranged to surround the inner cup lower portion 41 or the inner cup upper portion 42.

Hereinafter, a central portion of each lateral side in the substantially rectangular outer edge of the outer cup upper portion 51 is referred to as a lateral side central portion and a corner in the substantially rectangular outer edge of the outer cup upper portion 51 is referred to as a cup corner. Outside of the clearance S, the space V3 is formed to be surrounded by the lower surface 51a of the outer cup upper portion 51, the inner side surface 52a of the outer cup side portion 52 and the upper surface 53a of the outer cup intermediate portion 53. Hereinafter, the space V3 is referred to as the scatter capturing space V3.

As described above, the outer edges of the inner cup lower portion 41 and the inner cup upper portion 42 are shaped to be substantially circular in the horizontal cross section, and the outer edges of the outer cup upper portion 51, the outer cup side portion 52 and the outer cup intermediate portion 53 are shaped to be substantially rectangular in the horizontal cross section. Therefore, the scatter capturing space V3 is shaped to be rectangular in the horizontal cross section. The scatter capturing space V3 in the cup corner of the FIG. 3 is larger than the scatter capturing space V3 in the lateral side central portion of FIG. 1. Further, in a radial direction of the substrate W, a maximal length of the scatter capturing space V3 is larger than a maximal length of the collection space V1.

A drain port 7 is provided at the cup support member 13. The drain port 7 is also used as an exhaust port. The drain port 7 is connected to a drain system P4 in a factory. The drain system P4 includes a drain equipment and an exhaust equipment. Processing liquid and processing gas used in the processing cup C is drained from the drain port 7 of the cup support member 13 to the drain system P4.

A current plate 6 is arranged below the spin holder 1 to surround the rotation shaft 2 and the motor 3. The current plate 6 is fixed to an inner periphery of the cup support member 13 by a fixing member (not shown). This current plate 6 has an inclined surface inclined obliquely downward toward an outer periphery.

A processing liquid nozzle 9 that discharges the processing liquid on the substrate W is provided between a position above the substrate W and a waiting position outside of the outer cup 5 to be movable in the vertical direction. In the present embodiment, the processing liquid supplied from the processing liquid nozzle 9 is a development liquid, for example. The processing liquid may be a cleaning liquid, a rinse liquid (pure water, for example), a chemical liquid for forming an anti-reflection film on the substrate W or a resist liquid having a low viscosity. While the processing liquid preferably has a low viscosity (not more than 10 cP, for example), the invention is not limited to this.

The processing liquid nozzle 9 is connected to a processing liquid supply source P1 through a processing liquid supply pipe T1. A valve v1 is inserted into the processing liquid supply pipe T1. The valve v1 is opened such that the processing liquid is supplied from the processing liquid supply source P1 to the processing liquid nozzle 9 through the processing liquid supply pipe T1.

The substrate W is held in a horizontal attitude by the spin holder 1 while a surface to be processed is directed upward. In this state, the substrate W is rotated by the spin holder 1 and the processing liquid is discharged from the processing liquid nozzle 9 on the center of the surface to be processed of the substrate W. Thus, the processing liquid that has been discharged on the center of the surface to be processed of the substrate W is spread to the entire surface to be processed of the substrate W by a centrifugal force developed by the rotation of the substrate W.

In the substrate processing apparatus 100, the processing liquid can be supplied to a surface that is opposite to the surface to be processed of the substrate W (hereinafter referred to as a back surface). A processing liquid nozzle 8 for discharging the processing liquid on the back surface of the substrate W is provided below the back surface of the substrate W. In the present embodiment, the processing liquid supplied from the processing liquid nozzle 8 is the cleaning liquid, for example.

The processing liquid nozzle 8 is connected to a processing liquid supply source P2 through a processing liquid supply pipe T2. A valve v2 is inserted into the processing liquid supply pipe T2. The valve v2 is opened such that the processing liquid is supplied to the processing liquid nozzle 8 from the processing liquid supply source P2 through the processing liquid supply pipe T2.

In this state, the substrate W is rotated by the spin holder 1, and the processing liquid is discharged on the center of the back surface of the substrate W from the processing liquid nozzle 8. Thus, the processing liquid that has been discharged on the center of the back surface of the substrate W is spread to the entire back surface of the substrate W by the centrifugal force developed by the rotation of the substrate W.

Figure 6:
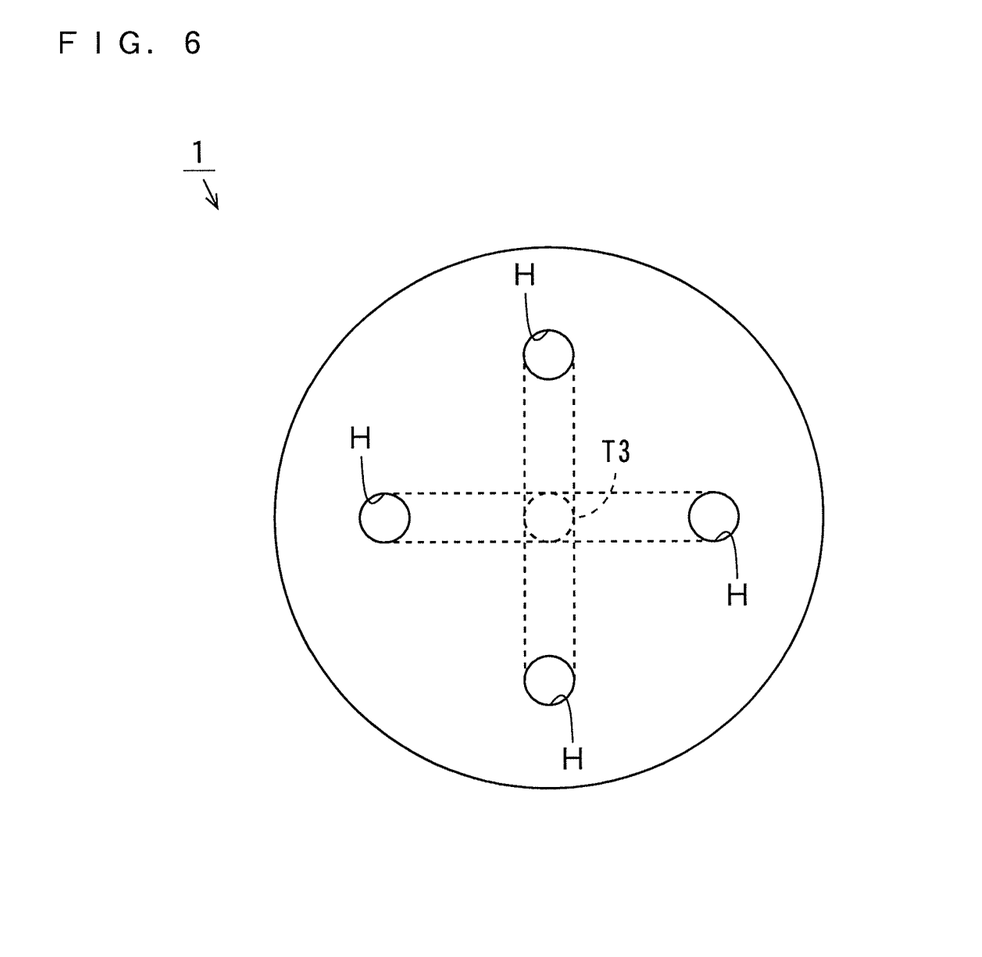
FIG. 6 is a plan view of a spin holder.

FIG. 6 is a plan view of the spin holder 1. As shown in FIG. 6, a plurality of (four in this example) openings H are formed in the spin holder 1. The plurality of openings H are connected to a processing gas supply source P3 through the rotation shaft 2 and a processing gas supply pipe T3 inserted into the inside of the motor 3 of FIGS. 1 to 3.

A valve v3 is inserted into the processing gas supply pipe T3. The valve v3 is opened such that the processing gas is supplied from the processing gas supply source P3 to the back surface of the substrate W through the processing gas supply pipe T3 and then the plurality of openings H. In the present embodiment, the processing gas supplied from the plurality of openings H is a nitrogen gas, for example. The processing gas may be another inert gas such as a helium gas, an argon gas or the like. The processing gas is supplied from the plurality of openings H to the back surface of the substrate W such that diffusion of the processing liquid that has been discharged on the back surface of the substrate W from the processing liquid nozzle 8 to the entire back surface of the substrate W is assisted.

The substrate processing apparatus 100 includes a controller 12. The controller 12 controls a rotation speed of the motor 3. Thus, the rotation speed of the substrate W held by the spin holder 1 is controlled. Further, the controller 12 controls the opening/closing of the valves v1 to v3. This causes the time for supplying the processing liquid and the processing gas to be controlled. Further, the controller 12 controls the cylinder 10. Thus, a position of the inner cup 4 in the vertical direction is adjusted between the lifted state and the lowered state.

(2) Processing of the Processing Liquid by the Processing Cup

Figure 7:
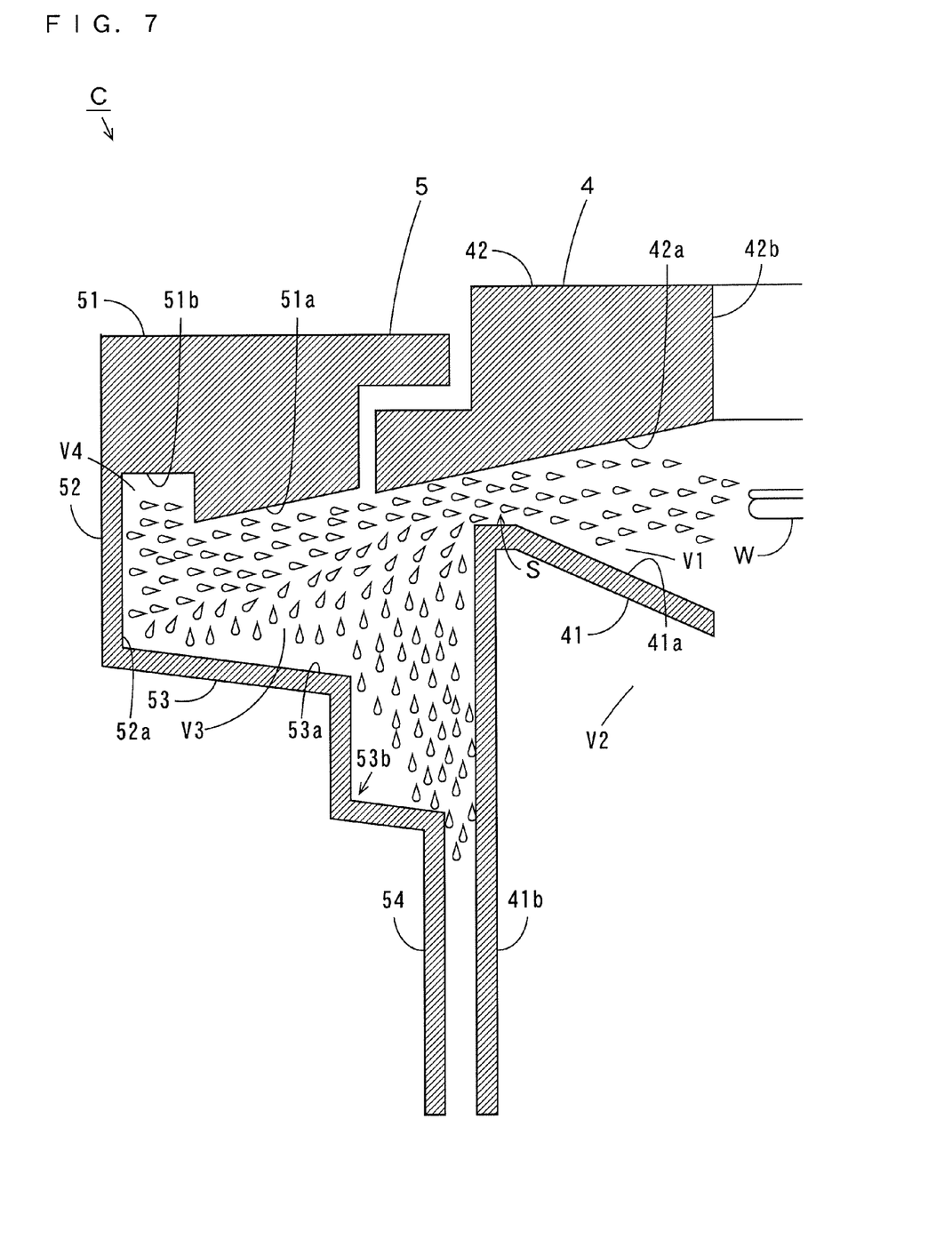
FIG. 7 is an enlarged cross sectional view of the section A of the processing cup of FIG. 1 while a substrate is rotated at a high speed.

FIG. 7 is an enlarged cross sectional view of the section A of the processing cup C of FIG. 1 while the substrate W is rotated at a high speed. As shown in FIG. 7, when the substrate W is rotated at a higher rotation speed than a predetermined rotation speed, the processing liquid having a high kinetic energy that has been supplied on the surface to be processed of the substrate W splashes outward from the outer periphery of the substrate W with a range in the vertical direction from the surface to be processed of the substrate W. Similarly, the substrate W is rotated at the higher speed than the predetermined rotation speed of the substrate W such that the processing liquid that has been supplied to the back surface of the substrate W splashes outward from the outer periphery of the substrate W with the range in the vertical direction from the back surface of the substrate W.

The distance between the upper surface 41a of the inner cup lower portion 41 and the lower surface 42a of the inner cup upper portion 42 is the largest at a position that is the closest to the substrate W. Therefore, the processing liquid that has splashed outward from the substrate W is collected in the collection space V1 formed between the upper surface 41a of the inner cup lower portion 41 and the lower surface 42a of the inner cup upper portion 42. The collected processing liquid is led outward along the upper surface 41a of the inner cup lower portion 41 and the lower surface 42a of the inner cup upper portion 42, thereby being gathered in the clearance S at the outer peripheries and passing through the clearance S.

Here, as shown in FIG. 5, because the upper surface 41a of the inner cup lower portion 41 is inclined upward at the inclination angle θ1, the processing liquid that has splashed outward from the substrate W can be easily collected in the collection space V1. The inclination angle θ1 is set to not less than 5 degrees and not more than 20 degrees such that the processing liquid that has splashed outward from the substrate W can reliably pass through the clearance S of the inner cup 4. Further, the processing liquid that has hit the upper surface 41a of the inner cup lower portion 41 can be reliably prevented from rebounding on the substrate W.

Similarly, because the lower surface 42a of the inner cup upper portion 42 is inclined downward at the inclination angle θ2, the processing liquid adhering to the lower surface 42a of the inner cup upper portion 42 is led to the collection space V1 via the lower surface 42a by the outward splashing force or gravity. Thus, the processing liquid that has splashed outward from the substrate W can be easily collected in the collection space V1. The inclination angle θ2 is set to more than 0 degree and not more than 20 degrees such that the processing liquid that has splashed outward from the substrate W can reliably pass through the clearance S of the inner cup 4. Further, the processing liquid that has hit the lower surface 42a of the inner cup upper portion 42 can be reliably prevented from rebounding on the substrate W.

The processing liquid that has passed through the clearance S of the inner cup 4 is captured at the inner surface 52a of the outer cup side portion 52 of the outer cup 5 after scattering in the scatter capturing space V3 in the outer cup 5. Further, the distance between the lower surface 51a of the outer cup upper portion 51 and the upper surface 53a of the outer cup intermediate portion 53 is gradually reduced outward from the outer peripheries of the lower surface 42a of the inner cup upper portion 42 and the upper surface 41a of the inner cup lower portion 41. Thus, part of the processing liquid that has passed through the clearance S of the inner cup 4 is reliably led to the inner side surface 52a of the outer cup side portion 52 by the lower surface 51a of the outer cup upper portion 51 and the upper surface 53a of the outer cup intermediate portion 53.

Here, as shown in FIG. 5, because the lower surface 51a of the outer cup upper portion 51 is inclined downward at the inclination angle θ3, the processing liquid that has passed through the clearance S of the inner cup 4 and has adhered to the lower surface 51a of the outer cup upper portion 51 is led to the inner side surface 52a of the outer cup side portion 52 via the lower surface 51a by the outward splashing force or gravity. Thus, the processing liquid that has passed through the clearance S can be reliably captured in the scatter capturing space V3. The inclination angle θ3 is set to more than 0 degree and not more than 20 degrees such that the processing liquid that has passed through the clearance S of the inner cup 4 and has hit the lower surface 51a of the outer cup upper portion 51 can be reliably prevented from rebounding to the collection space V1.

If a plurality of blocks of the processing liquid collide and scatter in the scatter capturing space V3, a mist of the processing liquid may be generated. Even in such a case, the mist of the processing liquid is pushed back by an outward flow of the processing liquid passing through the clearance S. Thus, the mist of the processing liquid is prevented from passing through the clearance S again to return to the collection space V1 between the upper surface 41a of the inner cup lower portion 41 and the lower surface 42a of the inner cup upper portion 42.

When the inner cup 4 is in the lifted state, the inner cup upper portion 42 is engaged by the upper engaging portion 51c of the outer cup upper portion 51. Here, the inner cup upper portion 42 and the outer cup upper portion 51 are close to each other. Therefore, the mist of the processing liquid is prevented from being discharged from a clearance between the inner cup upper portion 42 and the outer cup upper portion 51.

The processing liquid that has been captured in the scatter capturing space V3 is drained from the drain port 7 to the drain system P4 after falling on the bottom of the cup support member 13 of FIG. 1 by gravity. Thus, the processing liquid that has been captured in the scatter capturing space V3 can be reliably drained.

The scatter capturing space V3 in the cup corner of the processing cup C is larger than the scatter capturing space V3 in the lateral side central portion. Thus, a size of the scatter capturing space V3 can be reliably increased without increasing a size of the processing cup C as a whole. The processing liquid that has been discharged in the scatter capturing space V3 in the lateral side central portion can be diffused to the scatter capturing space V3 in the cup corner. Therefore, even if processing using a large amount of the processing liquid is performed in the processing cup C, the processing liquid that has splashed outward from the substrate W can be reliably prevented from adhering to the substrate W again.

Further, because the maximal length of the scatter capturing space V3 is larger than the maximal length of the collection space V1 in the radial direction of the substrate W, a large amount of the processing liquid can be captured in the scatter capturing space V3. Therefore, even if the large amount of the processing liquid has passed through the clearance S of the inner cup 4, the processing liquid that has rebounded on the inner side surface 52a of the outer cup side portion 52 in the direction toward the collection space V1 can be reliably prevented from passing through the clearance S again to return to the collection space V1.

Further, the acquisition space V4 is formed on a peripheral edge of the scatter capturing space V3. Thus, even if the processing liquid that has collided with the inner side surface 52a of the outer cup side portion 52 is spread upward or floated up, the processing liquid is acquired in the acquisition space V4. Thus, a sufficient amount of the processing liquid can be captured or acquired in the scatter capturing space V3 and the acquisition space V4 in the outer cup 5.

Further, the processing gas is supplied to the back surface of the substrate W from the plurality of openings H of the spin holder 1 of FIG. 6. In this case, the outward force generated by the processing gas that has been supplied to the back surface of the substrate W from the processing gas supply source P3 is added to the processing liquid that has been supplied to the back surface of the substrate W by the processing liquid nozzle 8. The outward force is added to the centrifugal force developed by the rotation of the substrate W, whereby the processing liquid that has been supplied to the back surface of the substrate W splashes outward from the outer periphery of the substrate W with the range in the vertical direction from the back surface of the substrate W.

Here, a width of the processing liquid in the vertical direction when the processing gas is supplied is smaller than a width of the processing liquid in the vertical direction when the processing gas is not supplied. Thus, the processing liquid that has splashed outward from the outer periphery of the substrate W is reliably captured in the scatter capturing space V3 in the outer cup 5.

Figure 8:
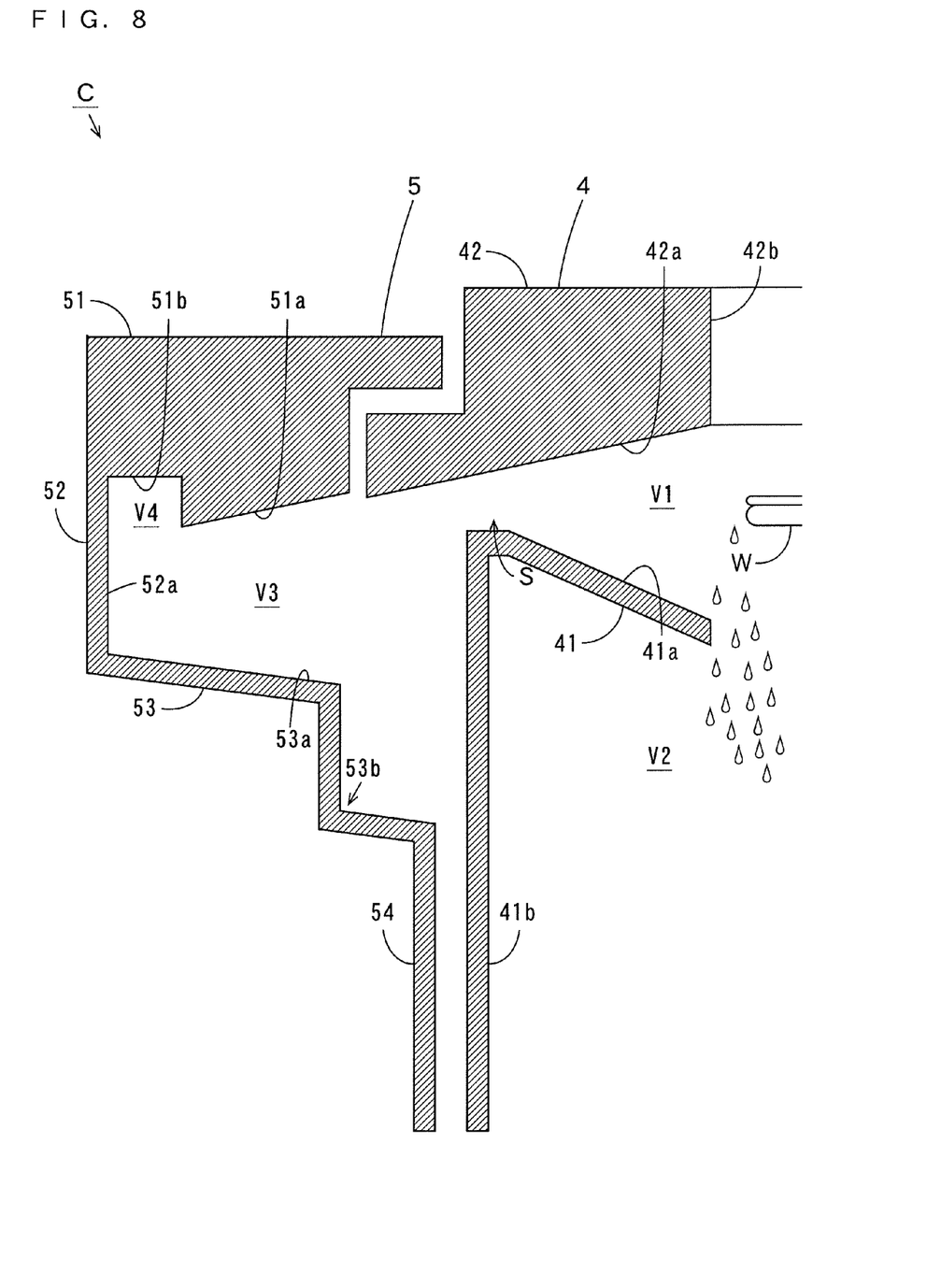
FIG. 8 is an enlarged cross sectional view of the section A of the processing cup of FIG. 1 while the substrate is rotated at a low speed.

FIG. 8 is an enlarged cross sectional view of the section A of the processing cup C of FIG. 1 while the substrate W is rotated at a low speed. As shown in FIG. 8, when the substrate W is rotated at a rotation speed lower than the predetermined rotation speed, the processing liquid having low kinetic energy that has been supplied to the surface to be processed of the substrate W falls downward from the outer periphery of the surface to be processed of the substrate W by gravity. Similarly, the substrate W is rotated at a rotation speed lower than the predetermined rotation speed such that the processing liquid that has been supplied to the back surface of the substrate W falls downward from the outer periphery of the back surface of the substrate W.

The processing liquid that has fallen downward from the outer periphery of the substrate W is collected in the collection space V2 below the inner cup lower portion 41. Thus, the processing liquid that has splashed outward from the substrate W can be prevented from adhering to the substrate W again. Further, because the processing liquid that has fallen downward from the outer periphery of the substrate W does not have high kinetic energy, the rebounded processing liquid is prevented from adhering to the substrate W again even if the plurality of blocks of the processing liquid collide and scatter in the collection space V2. The processing liquid that has been collected in the collection space V2 is drained from the drain port 7 of the cup support member 13 to the drain system P4.

(3) Effects

In the substrate processing apparatus 100 according to the present embodiment, the substrate W is rotated by the spin holder 1. In this state, the processing liquid is supplied to the substrate W by the processing liquid nozzles 8, 9. The processing liquid that has splashed outward from the substrate W by the centrifugal force developed by the rotation of the substrate W is collected in the collection space V1. The collected processing liquid is led outward along the upper surface 41a of the inner cup lower portion 41 and the lower surface 42a of the inner cup upper portion 42, thereby being gathered in the clearance S at the outer peripheries and passing through the clearance S.

The processing liquid that has passed through the clearance S of the inner cup 4 is captured at the inner side surface 52a of the outer cup side surface 52 after scattering in the scatter capturing space V3 in the outer cup 5. Further, part of the processing liquid that has passed through the clearance S is led to the inner side surface 52a of the outer cup side portion 52 by the lower surface 51a of the outer cup upper portion 51.

This configuration causes the processing liquid that has once passed outward through the clearance S of the inner cup 4 to be sufficiently captured in the scatter capturing space V3 in the outer cup 5, thereby not passing through the clearance S again to return to the collection space V1. As a result, the processing liquid that has splashed outward from the substrate W can be reliably prevented from adhering to the substrate W again.

(4) Other Embodiments (4-1) While the lower surface 42a of the inner cup upper portion 42 is inclined obliquely downward toward the outer periphery in the embodiment described above, the invention is not limited to this. The lower surface 42a of the inner cup upper portion 42 may horizontally extend outward.

(4-2) While the lower surface 51a of the outer cup upper portion 51 is inclined obliquely downward toward the outer periphery in the embodiment described above, the invention is not limited to this. The lower surface 51a of the outer cup upper portion 51 may horizontally extend outward.

(4-3) While the scatter capturing space V3 is shaped to be rectangular in the horizontal cross section in the embodiment described above, the invention is not limited to this. The scatter capturing space V3 may be shaped to be non-circular such as polygonal, oval, elliptical or the like. If the size of the processing cup C may be increased, the scatter capturing space V3 may be shaped to be circular in the horizontal cross section.

(4-4) While the plurality of openings H are formed at the spin holder 1 and the processing gas is supplied from the openings H of the spin holder 1 in the embodiment described above, the invention is not limited to this. Another nozzle for supplying the processing gas may be provided below the back surface of the substrate W and the processing gas may be supplied to the back surface of the substrate W from the nozzle for supplying the processing gas. In this case, the plurality of openings H do not have to be provided at the spin holder 1.

(5) Correspondences between Constituent Elements in Claims and Parts in Preferred Embodiments In the following paragraphs, non-limiting examples of correspondences between various elements recited in the claims below and those described above with respect to various preferred embodiments of the present invention are explained.

In the embodiment described above, the substrate W is an example of a substrate, the processing cup C is an example of a processing cup, the inner cup 4 is an example of a first cup, the outer cup 5 is an example of a second cup, the inner cup lower portion 41 is an example of a first member and the inner cup upper portion 42 is an example of a second member. The upper surface 41a is an example of a first upper surface, the lower surface 42a is an example of a first lower surface, the upper surface 53a is an example of a second upper surface, the lower surface 51a is an example of a second lower surface, the inner side surface 52a is an example of an inner side surface and the drain port 7 is an example of a drain port.

The clearance S is an example of a clearance, the collection spaces V1, V2 are examples of first and second collection spaces, respectively, the scatter capturing space V3 is an example of a scatter capturing space, the acquisition space V4 is an example of an acquisition space and the inclination angles θ1 to θ3 are examples of first to third angles, respectively. The substrate processing apparatus 100 is an example of a substrate processing apparatus, the spin holder 1 is an example of a spin holder, the processing liquid nozzles 9, 8 are examples of first and second processing liquid supply systems, respectively, and the opening H is an example of a processing gas supply system.

While preferred embodiments of the present invention have been described above, it is to be understood that variations and modifications will be apparent to those skilled in the art without departing the scope and spirit of the present invention. The scope of the present invention, therefore, is to be determined solely by the following claims.

I claim:

1. A processing cup provided to surround a substrate when processing using a processing liquid is performed on the substrate held in a substantially horizontal attitude, comprising:
    a first cup arranged to surround the substrate; and
    a second cup arranged to surround the first cup, wherein
    the first cup includes a first member having a first upper surface arranged to surround the substrate and a second member having a first lower surface arranged above the first upper surface of the first member to surround the substrate,
    the first and second members are configured such that a distance between the first upper surface and the first lower surface is gradually reduced outward from an outer periphery of the substrate and a clearance is formed between the first upper surface and the first lower surface at outer peripheries of the first and second members,
    a first collection space that collects the processing liquid is formed between the first upper surface and the first lower surface, and
    the second cup has a second lower surface, an inner side surface, and a second upper surface and is configured to form a scatter capturing space that allows the scattering of the processing liquid that has passed through the clearance and captures the scattering processing liquid, an upper portion of the scatter capturing space is partitioned by the second lower surface, an outer periphery of the scatter capturing space is partitioned by the inner side surface, a lower portion of the scatter capturing space is partitioned by the second upper surface, an outermost peripheral end of the second lower surface is positioned further below and further outward than an outermost peripheral end of the first lower surface, and the second lower surface is formed to lead the processing liquid that has passed through the clearance to the inner side surface.

2. The processing cup according to claim 1, wherein a second collection space that collects the processing liquid is formed below the first member.

3. The processing cup according to claim 1, wherein the second cup is configured to further form an acquisition space that acquires the processing liquid on a peripheral edge of the scatter capturing space.

4. The processing cup according to claim 1, wherein the first upper surface of the first member, the first lower surface of the second member and the clearance are shaped to be rotationally-symmetric about a common axis.

5. The processing cup according to claim 4, wherein the scatter capturing space is shaped to be non-circular about the common axis.

6. The processing cup according to claim 5, wherein
the scatter capturing space is shaped to be rectangular in a cross section vertical to the common axis.

7. The processing cup according to claim 1, wherein
the first upper surface of the first member is formed to be inclined outward upward at a first angle with respect to an upper surface of the substrate.

8. The processing cup according to claim 7, wherein
the first angle is not less than 5 degrees and not more than 20 degrees.

9. The processing cup according to claim 1, wherein
the first lower surface of the second member is formed to extend outward in parallel with an upper surface of the substrate or to be inclined downward at a second angle with respect to the upper surface of the substrate.

10. The processing cup according to claim 9, wherein
the second angle is more than 0 degree and not more than 20 degrees.

11. The processing cup according to claim 1, wherein
the second lower surface is formed to extend outward in parallel with an upper surface of the substrate or to be inclined downward at a third angle with respect to the upper surface of the substrate.

12. The processing cup according to claim 11, wherein
the third angle more than 0 degree and not more than 20 degrees.

13. The processing cup according to claim 1, wherein
the first lower surface of the second member is shaped to be annular, and
a maximal length from the clearance to the inner side surface of the second cup is larger than a maximal length from an inner edge of the first lower surface of the second member to the clearance in a radial direction of the substrate.

14. The processing cup according to claim 1, wherein
a distance between the second lower surface and the second upper surface of the second cup is gradually reduced outward from outer peripheries of the first lower surface and the first upper surface.

15. The processing cup according to claim 1, further comprising:
a drain port that leads the processing liquid in the scatter capturing space to a drain system.

16. A substrate processing apparatus that performs processing on a substrate, comprising:
a spin holder that rotates the substrate while holding the same in a substantially horizontal attitude;
a first processing liquid supply system that supplies a processing liquid to a first surface of the substrate held by the spin holder; and
the processing cup according to claim 1 provided to surround the substrate held by the spin holder.

17. The substrate processing apparatus according to claim 16, further comprising:
a second processing liquid supply system that supplies a processing liquid to a second surface that is opposite to the first surface of the substrate held by the spin holder; and
a processing gas supply system that supplies a processing gas to the second surface of the substrate held by the spin holder.

* * * * *